United States Patent [19]
Koizumi et al.

[11] Patent Number: 5,747,387
[45] Date of Patent: May 5, 1998

[54] REMOVAL METHOD OF ORGANIC MATTER AND SYSTEM FOR THE SAME

[75] Inventors: Koutarou Koizumi, Kodaira; Sukeyoshi Tsunekawa, Iruma; Kazuhiko Kawai, Kodaira; Maki Shimoda, Hachiouji; Katsuhiko Itoh, Nishitama-gun; Haruo Itoh, Hino; Akio Saito, Isogo-ku, all of Japan

[73] Assignees: Hitachi, Ltd.; Hitachi Microcomputer System Ltd., both of Tokyo, Japan

[21] Appl. No.: 519,399

[22] Filed: Aug. 25, 1995

[30] Foreign Application Priority Data

Sep. 1, 1994 [JP] Japan .................................. 6-208363

[51] Int. Cl.$^6$ .................................................. H01L 21/00
[52] U.S. Cl. ........................... 438/708; 438/906; 134/1.3
[58] Field of Search ........................ 156/643.1, 646.1, 156/345; 134/1, 1.2, 1.3; 216/66, 67; 438/708, 906

[56] References Cited

U.S. PATENT DOCUMENTS

| | | | |
|---|---|---|---|
| 4,341,592 | 7/1982 | Shortes et al. | 156/646.1 X |
| 5,007,981 | 4/1991 | Kawasaki et al. | 134/1.2 |
| 5,135,608 | 8/1992 | Okutani | 156/643.1 |
| 5,171,393 | 12/1992 | Moffat | 156/345 |
| 5,198,634 | 3/1993 | Mattson et al. | 216/69 X |

FOREIGN PATENT DOCUMENTS 2-000315  1/1990  Japan .

OTHER PUBLICATIONS

The Hitachi Hyoron vol. 73, No. 9 (1991) pp. 37–42.

*Primary Examiner*—Thi Dang
*Attorney, Agent, or Firm*—Antonelli, Terry, Stout, & Kraus, LLP

[57] ABSTRACT

According to the present invention, the surface of the sample is cleaned with water immediately after ashing of the resist the quality of which has been changed through ion implantation by ozone-containing gas, or ozone-containing gas and ultraviolet ray, or the sample is cleaned with water without being exposed to the atmosphere after ashing, thereby allowing the number of residues to be reduced to 1/100, decreasing the load in cleaning process by solution, cutting down the semiconductor device production cost and improving the semiconductor device productivity.

8 Claims, 3 Drawing Sheets

REMOVAL METHOD OF ORGANIC MATTER AND SYSTEM FOR THE SAME

BACKGROUND OF THE INVENTION

The present invention relates to an ashing and cleaning method and an ashing system and cleaning equipment which are used to strip the resist layer after a desired processing has been completed from a semiconductor wafer or liquid crystal substrate having a resist layer the surface of which is provided with patterning; this is intended to remove the organic matter from the solid surface, for example, to perform desired processing.

In the semiconductor device manufacturing process, resist is used as a mask for ion implantation and patterning, and is then removed when it is of no use any more. One of the resist removing methods known in the prior art is to provide ashing by the action of ozone-containing gas, or ozone-containing gas and ultraviolet ray. Systems using such methods are disclosed in THE HITACHI HYORON Vol.73, NO.9 (1991-9), pp. 37-42.

According to the conventional ashing process, when the resist having gone through the ion implantation process is removed by ashing, a great amount of residues are generated on the surface of the sample after treatment. These residues occur not only in the case of ashing by ozone-containing gas, or ozone-containing gas and ultraviolet ray, but also in the case of ashing using plasma. The residues have been removed so far from the sample surface by cleaning with several types of solutions.

However, higher integration of the semiconductor device in recent years has increased the diameter of semiconductor wafers and the number of production processes, and has promoted the trend for microstructure, resulting in greater volume of solution and greater frequency of cleaning in the process of cleaning with solutions. Furthermore, in order to improve yield rate, contamination removing capability by cleaning has come to be required to have the maximum level, with increased frequency in replacement of solution. This has resulted in increased loads in the process of cleaning with solution.

Under such circumstances, the residue produced in the ashing process gives a great impact to the solution cleaning process, there is a great demand for reduction in the number of residues in the ashing process.

As a means of reducing the number of residues generated in the ashing process, lowering of processing temperature in the conventional ashing process has been proposed. This proposal can be described as follows: (1) Resist is changed in quality by ion implantation, and cells are formed on the resist surface when heated in the ashing process. Said cells are considered to be the major cause for the residue; and (2) resist cells differ according to resist baking conditions prior to ashing, ion implantation conditions and the type of the resist. To reduce the resist cells, processing temperature must be kept at 100 degrees Celsius or less. In the method of ashing the resist by the action of ozone-containing gas, or ozone-containing gas and ultraviolet ray, however, the processing speed heavily depends on temperature. Thus, if the processing temperature is reduced to 100 degrees Celsius or less, the semiconductor device productivity is substantially reduced, without practical processing speed being ensured.

SUMMARY OF THE INVENTION

The object of the present invention is to ash the resist without reducing temperature in the ashing process using ozone-containing gas, or ozone-containing gas and ultraviolet ray, to ensure practical processing speed and to reduce the load on the cleaning process by solution due to the residues produced in the process, thereby improving productivity of the semiconductor device.

Said problems can be solved and said object can be attained by ashing the resist on the surface of the sample by the action of ozone-containing gas, or ozone-containing gas and ultraviolet ray, and by cleaning it with pure water immediately after the sample is discharged from the ashing processing chamber. The same effect can be gained by cleaning the sample discharged from the ashing processing chamber, without exposing it to the atmosphere; this provides the practical processing speed in the ashing process and reduces the load on the cleaning process by solution due to the residue.

In the ashing process, processing the resist having its quality changed in ion implantation causes cells to be formed on the resist surface. This phenomenon, known as popping, is caused by change in resist quality due to ion implantation. Popping varies according to the resist baking conditions prior to ion implantation, and ion implantation conditions; it is normally produced when the sample is heated up to 100 degrees Celsius or more. After ashing the sample where popping has occurred, the resist appears to have been removed; however, microscopic observation reveals a great amount of fine residues attached to the surface of the sample.

If the semiconductor wafer with residues in the semiconductor device manufacturing process is fed to the next process, the residue will be converted into contamination, resulting in defective semiconductor elements. To prevent this problem, the wafer is normally fed to the next process after removing the residue by cleaning with solution. It can be easily understood that the residue generated in the ashing process brings about a serious load in the cleaning process by solution. Thus, reduction in ashing temperature is proposed as a means for reducing the number of residues produced in the ashing process. This is an attempt to reduce the number of residues by ashing the sampling through control of resist popping, and is already put into practice in the ashing process using plasma. This is not practical, however, in the ashing process using ozone-containing gas, or ozone-containing gas and ultraviolet ray because the processing speed depends on the ashing temperature. A different residue reducing method has been required in the ashing process using ozone-containing gas, or ozone-containing gas and ultraviolet ray.

Against the said background, the present inventors have studied the residue reducing method by paying attention to the physical properties of the residue, and have found that a great many residues can be removed by cleaning the residues with water before it is subjected to secular changes after ashing. The following describes this mechanism. After having been moved out of the ashing processing chamber, the residue occurring on the sample surface has its temperature reduced because the sample is cooled, and the residue is further exposed to the atmosphere. At this time, reduced temperature serves to increase the contact of the residue with the sample surface. Exposure to the atmosphere causes it to react with some components therein, and to be secular-changed into something that cannot be removed by cleaning with water. The residue can be reduced to $1/100$ or less by mere washing with water if immediately after ashing. By way of an example, FIG. 3 illustrates the relationship between the time before water-cleaning of the resist having its quality changed by P-ion implantation, and the number of residues after cleaning with water, where the number of residues was obtained by counting those having a diameter of 0.3 μm or more by laser scattering. Within 10 minutes after ashing, the number of residues can be reduced to about 1/100 of the number immediately after ashing. The effect of reducing the number of residues declines with the passage of time. A similar effect can be gained by water cleaning the sample after ashing without allowing it to be exposed to the atmosphere.

The said observation eliminates the need of controlling the popping by reducing the processing temperature in the ashing process, thereby ensuring a practical processing speed. Furthermore, reduction in the number of residues by water cleaning can make the cleaning by solution lighter as compared with conventional cases.

DESCRIPTION OF THE PREFERRED EMBODIMENT

Embodiments of the present invention will be described with reference to the Figures.

Figure 1:
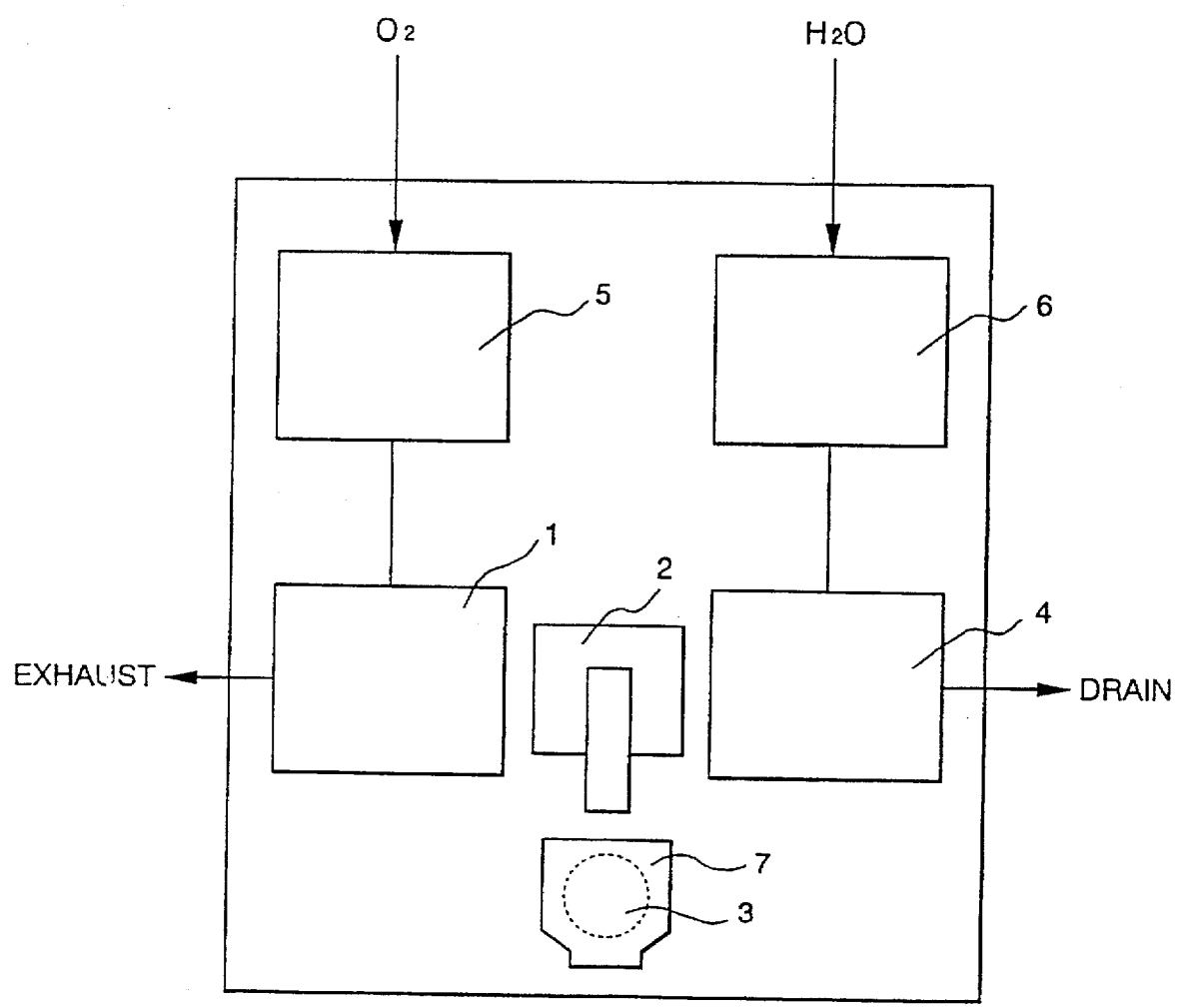
FIG. 1 is a schematic diagram representing the organic matter removing apparatus as a first embodiment of the present invention.

FIG. 1 represents one embodiment of the present invention, an organic matter removing apparatus used in the semiconductor device manufacturing process. The following describes the case of using said apparatus to remove the resist with its quality changed by ion implantation in the semiconductor device manufacturing process. Resist mask used in the ion implantation process is present on the surface of semiconductor wafer 3. The semiconductor wafer is housed in the wafer cassette 7, and is fed to the ashing processing chamber 1 by the wafer feeding means 2. The ashing processing chamber 1 comprises a wafer heating means having a temperature control function, a means to send ozone-containing gas to the wafer surface, a ON/OFF selection type ultraviolet ray source, an irradiation means and a processing chamber exhaust means. Ozone-containing gas is generated from oxygen gas as material by the ozone-containing gas generating means 5, and is fed to ashing processing chamber 1. The wafer has its resist ashed in the ashing processing chamber 1. Wafer 3 having been ashed is then fed from the ashing processing chamber 1 to the water cleaning chamber 4 by the wafer feed means 2. The water cleaning chamber 4 comprises a wafer cleaning means and a wafer drying means, and the feed water means 6 provides pure water. Wafer 3 is water-cleaned in the water cleaning chamber 4, and is returned to the wafer cassette 7 by wafer feed means 2. The above description has shown the resist removing process using said apparatus.

Figure 2:
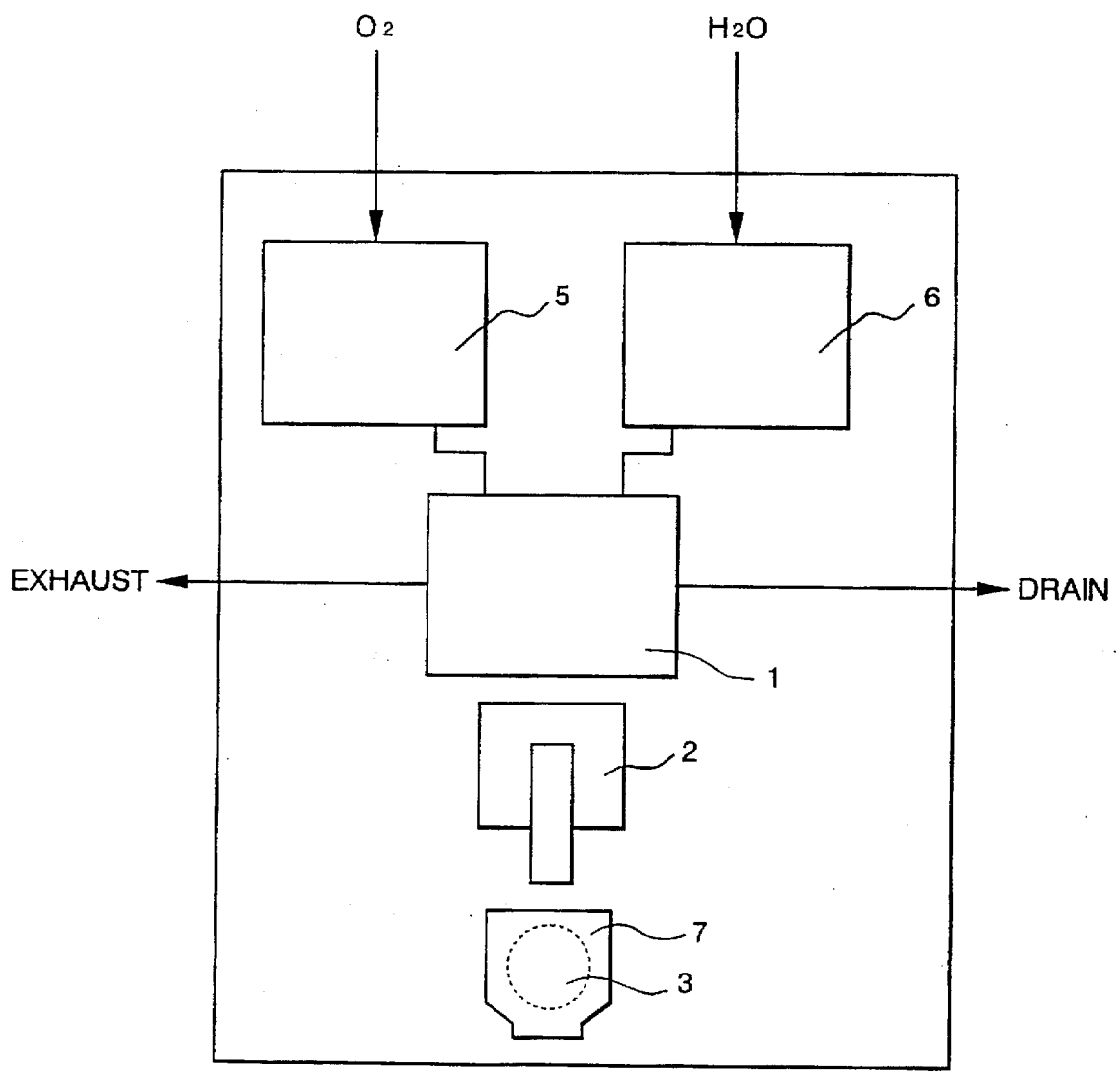
FIG. 2 is a schematic diagram representing the organic matter removing apparatus as another embodiment of the present invention.
Figure 3:
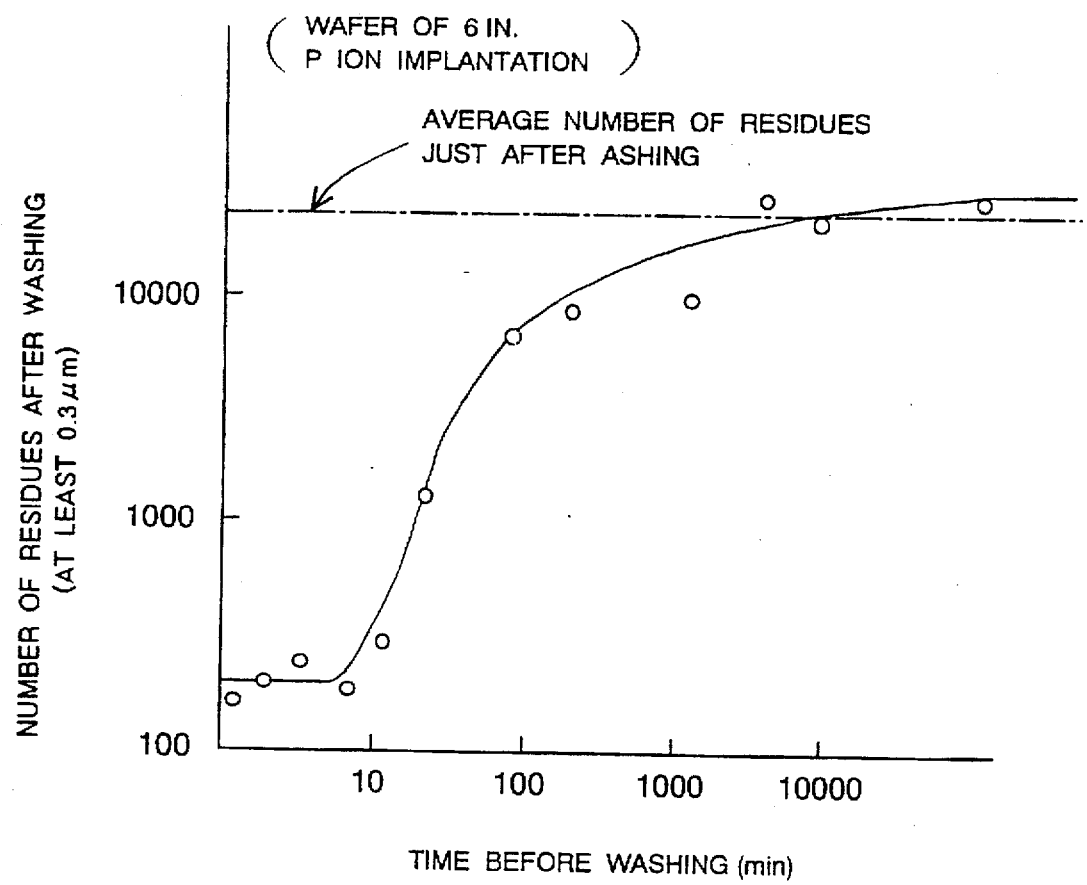
FIG. 3 illustrates an example representing the relation between the time before water-cleaning after ashing, and the number of residues after cleaning with water.

FIG. 2 illustrates a resist removing apparatus where ashing and water cleaning are performed in one and the same processing chamber, because the residue is often subjected to change during transit to water cleaning chamber after ashing in said embodiment 1. This apparatus allows the wafer to be cleaned without going out of the processing room after being ashed, thereby eliminating the possibility of change in residue quality, and ensuring the number of residues to be reduced.

TABLE 1

| Water cleaning immediately after ashing | Immediately after ashing | Water cleaning one day after ashing |
| --- | --- | --- |
| 480 pieces/wafer | 55,200 pieces/wafer | 50,500 pieces/wafer |

Table 1 shows the number of residues with the resists processed by the apparatus given in FIG. 1, that of the residues after ashing and that of that residues having treated by water cleaning one day after ashing. The number of residues was obtained by counting those having a diameter of 0.3 μm or more by laser scattering, and 6-inch wafers are used in this experiment. As is clear from the Table, the number of residues can be reduced to 1/100. In the conventional method, when the resist with its quality changed by conventional ion implantation is ashed by ozone-containing gas, or ozone-containing gas and ultraviolet ray, a great many residues have been generated on the surface of the sample, giving a serious load to the cleaning process by solution. However, the resist removing method and apparatus according to the present invention allows the residues generated in ashing to be reduced only by water cleaning, thereby decreasing the load in cleaning process by solution, cutting down the semiconductor device production cost and improving the semiconductor device productivity.

What is claimed is:

1. A method of removing organic matter of a photoresist layer patterned on a surface of a semiconductor wafer after processing of said wafer, characterized in that said photoresist layer is first removed by ozone-containing gas, or ozone-containing gas and ultraviolet ray, at a temperature greater than 100° C.; said semiconductor wafer is thereafter cleaned by pure water; the semiconductor wafer is cleaned with water within ten minutes after the photoresist layer is removed by ozone-containing gas, or ozone-containing gas and ultraviolet ray; and prior to removal of the photoresist layer, ion implantation has been performed as said processing of the semiconductor wafer.

2. A removal method of organic matter according to claim 1 wherein the photoresist layer is removed by ozone-containing gas, or ozone-containing gas and ultraviolet ray, and the semiconductor wafer is cleaned with water, without said wafer being exposed to the atmosphere.

3. A removal method of organic matter according to claim 1 wherein the semiconductor wafer is cleaned by water with its temperature maintained at 50 degrees Celsius or more, after the photoresist layer is removed by ozone-containing gas, or ozone-containing gas and ultraviolet ray.

4. A removal method of organic matter according to claim 1 wherein the semiconductor wafer is subjected to single wafer processing.

5. A removal method of organic matter according to claim 1 wherein removal of the photoresist layer by ozone-containing gas, or ozone-containing gas and ultraviolet ray, and cleaning of the semiconductor wafer by pure water, are both performed in a single processing chamber, without exposing said semiconductor wafer to the atmosphere.

6. A method of removing organic matter of a photoresist layer patterned on a surface of a substrate after processing of said substrate, characterized in that said photoresist layer is first removed by ozone-containing gas, or ozone-containing gas and ultraviolet ray, at a temperature greater than 100° C., and said substrate is thereafter cleaned by pure water, wherein removal of the photoresist layer by ozone-containing gas or by ozone-containing gas and ultraviolet ray, and cleaning with pure water, are performed in a single processing chamber, without exposing said substrate to the atmosphere; and prior to removal of the photoresist layer, ion implantation has been performed as said processing of the semiconductor wafer.

7. A removal method of organic matter according to claim 6, wherein said substrate is a semiconductor wafer.

8. A method of removing organic matter of a photoresist layer patterned on a surface of a substrate after processing of said substrate, characterized in that said photoresist layer is first removed by ozone-containing gas, or ozone-containing gas and ultraviolet ray, at a temperature greater than 100° C., and said substrate is thereafter cleaned by pure water, wherein the substrate is cleaned with water within ten minutes after the photoresist layer is removed by ozone-containing gas, or ozone-containing gas and ultraviolet ray; and prior to removal of the photoresist layer, ion implantation has been performed as said processing of the semiconductor wafer.

* * * * *